United States Patent [19]

Nelson

[11] Patent Number: 4,868,049
[45] Date of Patent: Sep. 19, 1989

[54] SELECTIVE METALLIC TRANSFER FOILS FOR XEROGRAPHIC IMAGES

[75] Inventor: Marshall A. Nelson, Lansing, Ill.

[73] Assignee: Omnicrom Systems Limited, London, England

[21] Appl. No.: 53,066

[22] Filed: May 21, 1987

Related U.S. Application Data

[60] Division of Ser. No. 918,365, Oct. 14, 1986, Pat. No. 4,724,026, which is a continuation-in-part of Ser. No. 698,241, Feb. 5, 1985, abandoned.

[51] Int. Cl.$^4$ .............................................. B32B 5/16
[52] U.S. Cl. .................................... 428/328; 428/323; 428/354; 428/344
[58] Field of Search ............... 428/343, 353, 354, 344, 428/328, 331, 323, 144, 145, 148; 156/247

[56] References Cited

U.S. PATENT DOCUMENTS

| | | | |
|---|---|---|---|
| 2,955,035 | 10/1960 | Walkup et al. | 96/1 |
| 2,955,052 | 10/1960 | Carlson et al. | 117/17.5 |
| 2,955,531 | 10/1960 | Bogdonoff | 101/128.2 |
| 3,080,270 | 3/1963 | Lorenz | 156/233 |
| 3,088,402 | 5/1963 | Newman | 101/149.4 |
| 3,357,830 | 12/1967 | Bixby | 96/1.2 |
| 3,519,512 | 7/1970 | Downs | 428/141 X |
| 3,703,603 | 11/1972 | Levesoue et al. | 174/68.5 |
| 3,753,850 | 8/1973 | Brunet | 161/214 |
| 3,764,309 | 10/1973 | Tamai et al. | 96/1 R |
| 3,840,385 | 10/1974 | Yoskida | 117/17.5 |
| 4,006,267 | 2/1977 | Kurz, deceased | 427/14 |
| 4,012,552 | 3/1977 | Watts | 428/202 |
| 4,028,165 | 6/1977 | Rosenfeld | 156/234 |
| 4,040,828 | 8/1977 | Evans | 96/1.2 |
| 4,053,344 | 10/1977 | Hirahara | 156/247 |
| 4,205,989 | 6/1980 | Moriya et al. | 430/306 |
| 4,330,352 | 5/1982 | Grimes et al. | 156/235 |
| 4,465,538 | 8/1984 | Schmoock | 156/233 |
| 4,484,970 | 11/1984 | Burzlaff et al. | 156/233 |
| 4,578,298 | 3/1986 | Nagafuchi | 428/344 X |

FOREIGN PATENT DOCUMENTS 0042632 12/1981 European Pat. Off. .
2002689 2/1979 United Kingdom .

Primary Examiner—George F. Lesmes
Assistant Examiner—M. A. Katz
Attorney, Agent, or Firm—Willian Brinks Olds Hofer Gilson & Lione

[57] ABSTRACT

The present invention is directed to a metal foil transfer sheet for selectively transferring metallic foil to xerographic images on a receiving substrate such as paper. The transfer sheet comprises, in successive layers, a carrier film, a metallic film and an adhesive, the adhesive containing a dispersion of 0.5 micron or larger particulate material. In the preferred embodiment, the invention comprising an assembly for a metal foil transfer sheet and a backing sheet.

9 Claims, 2 Drawing Sheets

SELECTIVE METALLIC TRANSFER FOILS FOR XEROGRAPHIC IMAGES

CROSS REFERENCE TO RELATED APPLICATION

This application is a divisional application of co-pending application Ser. No. 06/918,365, entitled "Process For Selective Transfer of Metallic Foils to Xerographic Images", filed Oct. 14, 1986, now issued as U.S. Pat. No. 4,724,026, which is a continuation-in-part application of then co-pending application Ser. No. 06/698,241, filed Feb. 5, 1985, now abandoned.

BACKGROUND OF THE INVENTION

1. Field of the Invention

The present invention relates generally to the art of selective transfer processes, and specifically to the selective transfer of metallic foils to xerographic images.

2. Background Art

The method for obtaining a copy of an original by electrostatic imaging is well known in the art, and is described in U.S. Pat. Nos. 2,397,691 and 2,357,809 to Carlson. The method generally comprises:

(1) electrostatically charging a photosensitive plate;
(2) irradiating the plate with actinic radiation to dissipate the charge in exposed areas and form an electrostatic image in unexposed areas;
(3) dusting the plate with a pigmented resin powder carrying an opposite electrostatic charge to the charge of the electrostatic image, such that the powder is attracted and then attached to the image area;
(4) transferring the image from the plate to a copy sheet by mechanical or electrical means; and
(5) fixing the powdered image on the copy sheet by heat or chemical treatment.

Various patents have disclosed methods for obtaining color copies. For example, U.S. Pat. No. 3,057,720 to Hayford et al. discloses a method for xerographic color reproduction, wherein the same general xerographic steps as outlined above are used in combination with the known "subtractive principle" of mixing primary colors, in a manner fully described in the '720 patent. U.S. Pat. No. 3,088,402 to Newman discloses a method of producing an imaged hectograph master by superposing a transfer sheet coated with a transferable layer of dye-carrying composition upon a sheet including a xerographic image and heating the sheets to render the xerographic image tacky. The transfer sheet is then stripped from the resulting imaged hectograph master. Similarly, U.S. Pat. No. 4,006,267 to Kurz, deceased, discloses placing a colored transfer donor in face-to-face contact with an image portion of a xerographic copy, heating the xerographic image, and removing the transfer donor to transfer the color of the donor layer to the image portion of the xerographic copy.

Methods for the selective transfer of metallic foils have also been disclosed. For example, U.S. Pat. No. 4,053,344 to Hirahara discloses placing a stamping foil, having an adhesive on one side, over ink which is dried until tacky. The adhesive is of a type which reacts with and adheres to the ink but does not adhere to the article. U.S. Pat. No. 3,519,512 to Downs similarly discloses using an ink-type "sensitizer" to adhere metallic foil to a substrate.

However, the process of selectively transferring metallic foils to a xerographic toner image is not specifically disclosed by the prior art. There are several difficulties encountered while developing a transfer sheet that consistently transfers a well defined metallic overlay to a xerographic toner image substrate. This is particularly true when providing a selective transfer to a toner image produced by common office photocopy equipment.

One difficulty encountered is that many toners include a release component to aid in removal of the toner from the plate once the toner is bound to the copy sheet. The copy sheet is generally a porous paper, to which the toner powders mechanically adhere as they are fused. Thus the toner can still bond to the copy sheet while the release component prevents adherence of the toner to photocopy machine elements.

Beside release components included in the makeup of the toner itself, silicone oil is often applied to machine parts to prevent the toner from sticking to them. During operation of the photocopy machine, this silicone oil coats the exposed surface of the xerographic image. Thus, when attempting to bond a metallic foil to the image, the silicone oil acts to prevent such bonding.

Consistent coverage of the xerographic image is difficult to achieve because of differences in the toner compositions of different manufacturers, differences in photocopy machine operation, etc. If the metallic foil adheres too readily, bridging occurs. Bridging is a term used to describe the situation where a single continuous portion of metallic film adheres to two or more discontinuous portions of the xerographic toner image, covering a portion of the copy sheet which does not have toner on it. A simple illustration of bridging is the filling in of images of letters or numbers normally having a void space, such as "a", "e", "o", etc.

On the other hand, the makeup of a toner xerographic image of one particular letter or other element of the total image is seldom uniform across the surface area of the letter or element. Thus, if the metallic film does not adhere well enough to the toner, only parts of the image will be selectively coated.

SUMMARY OF THE INVENTION

A method is provided for forming images overlaid with metallic foil. According to the method of the present invention, a sheet comprising xerographic images is provided and placed in face-to-face contact with a metal transfer sheet, to form a sandwich with the xerographic images on the inside. Heat and pressure are applied to the sandwich, causing the xerographic images to become tacky and causing the metallic foil to selectively adhere to the images. The remainder of the transfer sheet is then stripped away from the resulting decorated sheet comprising xerographic images overlaid with metallic foil.

In the preferred embodiment of the invention, the metal transfer sheet is provided with an adhesive of high filler content resin which has been found to produce good quality transfers to xerographic images produced by a wide variety of toners and photocopy machinery.

An important object of the invention is to provide a quick and easy method of selectively coating the image portions of a substrate with metallic foil. This object is accomplished in accordance with the present invention, as for example in the presently preferred embodiment, by passing the sandwich through heated rollers at a suitable temperature and pressure for transferring the foil to the xerographic images.

Further objects and attendant advantages will best be understood by a study of the appended detailed description of the preferred embodiments, taken together with the drawings.

BRIEF DESCRIPTION OF THE DRAWINGS

FIG. 4 shows a diagrammatic cross-sectional view of a roller pair for use in accordance with an embodiment of the present invention.

FIG. 5 shows a diagrammatic cross-sectional view of a roller pair and a pre-heating lamp for use in accordance with an embodiment of the present invention.

FIG. 6 shows a diagrammatic cross-sectional view of a roller pair and a pre-heating oven for use in accordance with an embodiment of the present invention.

FIG. 7 shows a diagrammatic cross-sectional view of a roller and platen pair for use in accordance with an embodiment of the present invention.

FIG. 8 shows a diagrammatic cross-sectional view of a platen pair for use in accordance with an embodiment of the present invention.

DETAILED DESCRIPTION OF THE PREFERRED EMBODIMENTS

Figure 1:
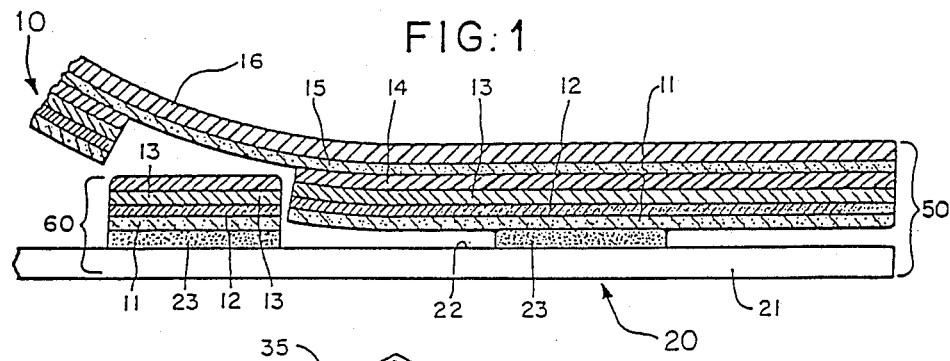
FIG. 1 shows a diagrammatic cross-sectional view of a colored metal transfer sheet and receiving substrate in use in a preferred embodiment of the present invention.

Turning now to the drawings, FIG. 1 shows a presently preferred transfer sheet indicated generally as 10, and a receiving substrate, such as paper, indicated generally as 20. The transfer sheet 10 of the preferred embodiment shown in FIG. 1 includes an adhesive 11, a primer 12, a metallic film 13, a clear or colored polymer coat 14, a release coat 15 and a carrier film 16. The receiving substrate 20 of this preferred embodiment comprises a sheet of paper 21 including an enamel treated surface 22 and xerographic images 23 thereon. For the purposes of this disclosure and the following claims, the term "xerographic images" is to be broadly construed to include clear or pigmented polymer powders deposited by the xerographic or other electrostatic image-forming processes. For example, such "xerographic images" might include polymer powders deposited by only the first four steps of the xerographic process described above in the Background of the Invention, while the fifth step may be omitted.

Alternate, less preferred embodiments are contemplated in which various ones of the components shown in FIG. 1 may be omitted or substituted. For example, the transfer sheet 10 may be constructed to include only the metallic film 13 and the carrier film 16; likewise, the enamel treated surface 22 of the receiving substrate 20 may be omitted, with only an untreated sheet of paper 21 to be used instead. Moreover, the sheet of paper 21 may be substituted with any other sheet material capable of holding xerographic images while being nonadherent with respect to the adhesive 11 (or the metallic film 13, in the absence of any adhesive 11 or primer 12). For example, a polyester film treated with a high-melting acrylic primer (which has a softening point higher than that of the xerographic toner), can be substituted for the sheet of paper 21.

Figure 2:
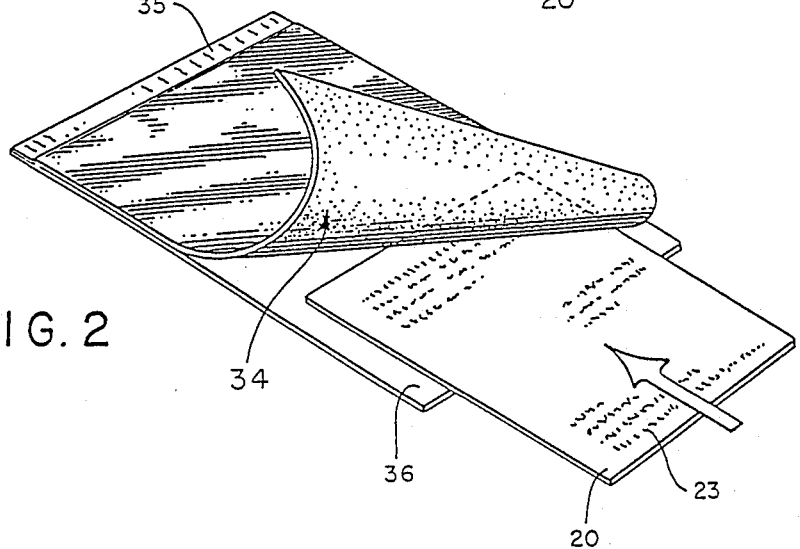
FIG. 2 shows a diagrammatic perspective view of a transfer sheet assembly and receiving substrate for use in a second preferred embodiment of the present invention.
Figure 3:
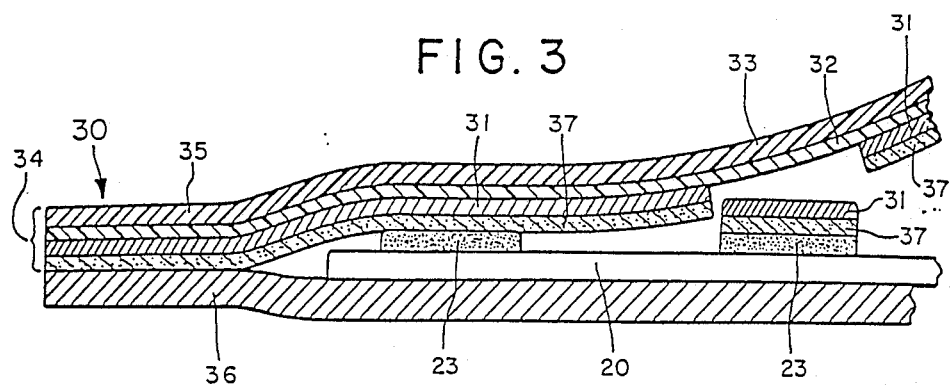
FIG. 3 shows a diagrammatic cross-sectional view of the transfer sheet assembly and receiving substrate of FIG. 2 in use in the second preferred embodiment of the present invention.

FIGS. 2 and 3 illustrate a transfer sheet assembly, indicated generally as 30, to be used in a second preferred embodiment of the invention. The transfer sheet assembly 30 of FIG. 3 includes a vacuum deposited metallic film 31 disposed upon a clear or colored polymer film 32, such as, for example, an acrylic film like methyl methacrylate or a methacrylate or a methacrylate copolymer, which is in turn disposed upon a polyester carrier 33. An adhesive layer 37 preferably coats the metallic film 31 on the opposite side from the clear polymer film 32. The metallic film 31, adhesive layer 37, polymer film 32 and the polyester carrier 33 together form a transfer sheet 34 that is adhered at an upper edge to a backing sheet 36. As shown in FIG. 2, the transfer sheet 34 may be attached to the backing sheet 36 by a piece of pressure sensitive tape 35.

When the transfer sheet assembly 30 is provided with a backing sheet 36 as seen in FIGS. 2 and 3, the receiving substrate is positioned in between the transfer sheet 34 and the backing sheet 36 (as expressly shown in FIG. 2). Correspondingly the transfer sheet 10 may be in the form of a roll (see, e.g., FIG. 4), or may be used to make transfer sheet assemblies such as the one depicted in FIG. 2.

In use, the transfer sheet 10 or the transfer sheet 34 is placed in face-to-face contact with the receiving substrate 20 to form a sandwich 50 with the xerographic images 23 on the inside, as seen in FIGS. 1 and 3. Heat and pressure are applied to the sandwich 50, causing the xerographic images 23 to become tacky and causing the metallic foil to selectively adhere to the images 23. The unadhered portion of the transfer sheet 10 or the transfer sheet assembly 30 is then stripped away from the resulting decorated sheet 60 comprising the xerographic images 23 overlaid with the metal film 13 or 31.

Figures 4, 5:
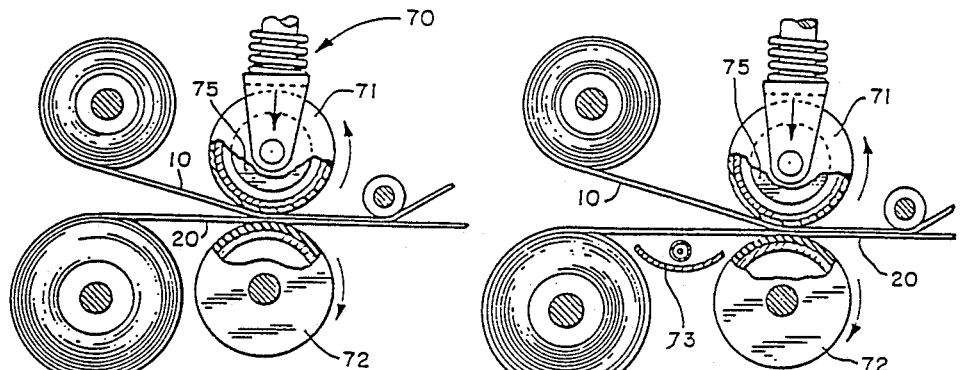
FIGS. 4 through 8 show various apparatus with which the various embodiments of the method of the present invention can be performed.
Figure 6:
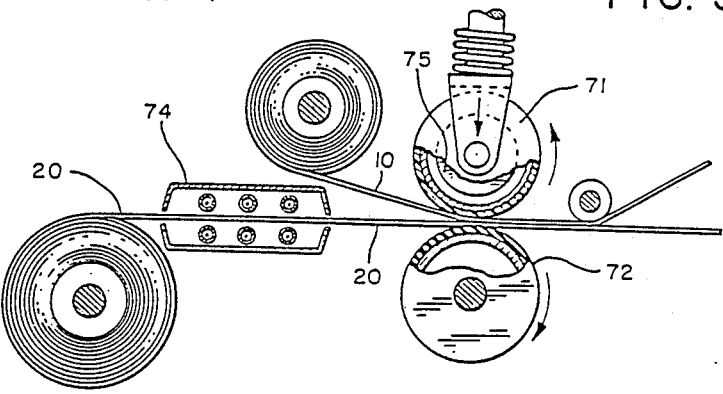
Figures 7, 8:
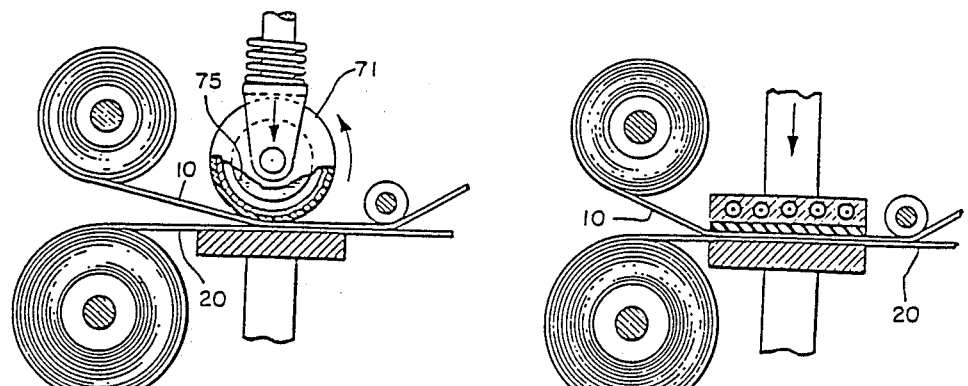

Various means can be used to apply pressure and temperature in accordance with the present invention, examples of which are given in FIGS. 4 through 8. Each apparatus in the drawings includes a pair of elements for the application of pressure to the sandwich 50 (formed from the transfer sheet 10 or the transfer sheet assembly 30, and the receiving substrate 20), and heating means which can be included in one of the pressure application elements and/or upstream the pair of pressure application elements. It is generally preferred that at least one of the pair of pressure application elements be formed of a resilient material at least at the area where contact is to be made with the transfer sheet 10 or transfer sheet assembly 30, to ensure the desired conformity of opposing surfaces of the pair as the sandwich passes therethrough. The apparatus shown in FIG. 4 represents the presently preferred means for performing these pressure application and heating functions, and will be more fully discussed below. The apparatus shown in FIGS. 5 and 6 are similar to that shown in FIG. 4, but include preheating means upstream the pair of pressure application elements: FIG. 5 includes a heat lamp 73 and FIG. 6 includes an oven 74. Such preheating means can be used to pre-heat the entire sandwich 50 (i.e., the combined transfer sheet 10 or assembly 30 and receiving substrate 20), or to simply pre-heat the receiving substrate 20. Embodiments including such pre-heating means are expected to be highly advantageous in that the rate of travel of the transfer sheet 10 or the transfer sheet assembly 30 will be increased, since it will not be necessary to maintain as great a dwell time in the pressure applying portions of the apparatus in order to achieve the desired temperature in the xerographic images.

In the presently preferred embodiment, the heat and pressure are applied by passing the sandwich 50 through a pair of rollers 70, as shown in FIGS. 4. The pair of rollers 70 comprises a first roller 71, made, for example, from teflon coated aluminum, and a second roller 72, made, for example, from silicone rubber or having a silicone rubber surface. In this presently referred embodiment, the first roller 71 is heated by heater 75 to a temperature in the range of from about 200 to about 375 degrees Fahrenheit, and most preferably a temperature of about 350 degrees Fahrenheit. The applied pressure is preferably in the range of from about 1 to about 20 pounds per square inch, and most preferably about 11 pounds per square inch. The pressure is applied to a contact area that is preferably of about 0.05 to about 0.3 square inches per inch of line contact, and most preferably about 0.15 square inches per inch of line contact. This contact area exists due to the slight flattening deformation of the silicone rubber roller 72, which has a hardness in the preferred range of from about 40 to about 80 durometers, and most preferably in the range of from about 50 to about 60 durometers. The presently preferred contact or dwell time is in the range of from about 0.01 to about 0.4, and most preferably is about 0.09 seconds, such that the sheet feed rate is preferably in the range of from about 25 to about 500 inches per minute, and most preferably approximately 100 inches per minute. For the purpose of the present invention, "dwell" or "contact" time is the period of time during which pressure is applied to the portion of the sandwich in contact with the pair of rollers 70 (or other pressure-applying element) to develop adhesion to the toner and effect transfer. These parameters have been developed in the presently preferred embodiments because of the excellent results they produce when used with the presently preferred transfer sheet 10 and transfer sheet assembly 30, each of which will now be described in detail.

The presently preferred embodiment of the transfer sheet 10 includes each of the components shown in FIG. 1. It has been discovered that an improved transfer sheet and sheet assembly can be made using a large amount of a large particle size filler in the adhesive layer 11 or 37. The amount and type of filler is important to provide good coverage when making a transfer to a substrate with small, intricate areas to be selectively covered by the metal layer 13 or 31. For example, if a substrate has a xerographic image made from a typewritten document, the small openings in certain letters (o, a, e, etc.) have a tendency to fill in if the transfer provides good bridging. However, if the tensile strength of the transfer layer is reduced to prevent such fill in, then the letters which are not well defined may be covered in a spotty fashion.

In the preferred embodiment of the metal or color transfer assembly, the adhesive layer is made from one part acrylic resin, two parts vinyl chloride vinyl acetate copolymer, and four parts titanium dioxide. 93 parts isopropyl acetate are used as a carrier to mix the materials and to help coat the back of the transfer layer by a roto-gravure or wire wound doctor rod process. One tenth part of carbon black may also be used in the adhesive composition to provide a "grey" cast to the adhesive where such a coloring is needed. It can be seen that the resin: solids ratio is approximately 3:4. The preferred particulate is 0.5 micron or larger in size. A suitable particulate is DuPont R100. A suitable acrylic resin is Aroset 1044-Z-40 from Ashland Chemical Co. A suitable vinyl chloride vinyl acetate copolymer is Union Carbide VMCC.

The improved adhesive layer allows for consistent, high resolution coverage using the short dwell times specified above. One method by which the adhesive layer produces such exceptional results is that the adhesive layer provides controlled bridging in the transfer layer by reducing the tensile strength of the adhesive layer and propagating a crack in the adhesive layer (between a surface to be covered by the transfer and adjacent surfaces not to be covered) through the metal film layer. This provides better resolution in the transfer, but controls bridging. The adhesive layer described provides opacity to the transferred layer, especially where the layer 13 or 31 is a very thin metal layer to be affixed to a dark colored xerograph image. Also, the opacity masks streaks in the vacuum deposited metal layer, which is difficult to form uniformly.

The improved adhesive layer also provides increased "surface area" for adhesion. When xerographic reproductions have a thin film of silicone oil on the surface of the toner to prevent the toner from adhering to other parts inside the machine, the silicone prevents the adhesive from adhering to the toner image. The large amounts of particulate used in the preferred embodiment of the invention increases the effective surface area of the adhesive layer, allowing any silicone to fill interstitial voids between particles at the surface and putting some "teeth" into the adhesive layer.

The primer 12 is made from vinyl chloride/vinyl acetate/maleic acid copolymer. Such a material can be obtained from Union Carbide as UCAR® Grade UMCH. The metallic film 13 can be made from any of a variety of metals, such as aluminum, copper, chromium, tin, silver and gold, and the like, and in the preferred embodiment is made by vacuum deposition onto methyl methacrylate to a thickness preferably just approaching but not attaining optical opacity. Such vacuum deposited films can be obtained from Gomar Mfg. Co. of Linden, N.J. The presently preferred release coat 15 is made from an ethylene vinyl acetate copolymer. Such a material can be obtained from DuPont as EL-VAX-40. Finally, the presently preferred carrier film 16 is made from polyester film (extruded and oriented polyethylene terephthalate, having a thickness in a range of 0.4 to 2 mils). Such a material can be obtained from ICI America as 0.5 mil type H film. The polymer coats 14 can be applied from an isopropyl acetate solution, while the primer 12 can be applied from a methyl ethyl ketone solution and the described release coat 15 can be applied from a toluol solution. An ideal composite film thickness (i.e., the combined thickness of all coating components except for the carrier film 16) has been found to be in the range of from about 0.02 mils to about 0.06 mils, and is optimally about 0.03 mils. Thicker composite films give decreased image resolution, while thinner composite films lose their integrity upon transfer and induce undesirable optical effects.

It should be understood that the materials and details of construction of the foregoing detailed description are given only by way of illustration, and not limitation. These materials and details of construction can be varied to suit individual applications within the scope of this invention, as will be apparent to one of ordinary skill in the art. For example, the metal need not be vacuum deposited, but can be applied to a coating by the equivalent processes of silver reduction, organic solvent deposition, or the like. Moreover, the polymer coatings can be applied from water-based solutions or dispersions. Accordingly, it is intended that the following claims and all equivalents thereof, and not the foregoing detailed description, be taken to define the scope of this invention.

I claim:

1. A metal foil transfer sheet for selectively transferring a metal film to a xerographic image, the transfer sheet comprising, in successive layers:
    a carrier film,
    a metallic film comprising a metal selected from the group consisting of aluminum, copper, chromium, tin, silver, gold and mixtures thereof, and
    an adhesive layer bonded to the metallic film and which is suitable to cause a selective transfer of the metallic film to the xerographic image, the adhesive layer comprising a resin and a dispersion of 0.5 micron or larger particulate material.

2. A metal foil transfer sheet as in claim 1 attached at an upper edge to a backing sheet to form a metal foil transfer sheet assembly.

3. The metal foil transfer sheet assembly of claim 2 wherein the particulate material comprises titanium dioxide in a ratio of about 4 parts titanium dioxide to 3 parts resin.

4. The metal foil transfer sheet of claim 1 wherein the transfer sheet comprises in successive layers:
    the carrier film,
    a release coat,
    a polymer coat,
    the metallic film,
    a primer and
    the adhesive.

5. The metal foil transfer sheet of claim 1 wherein the metallic film comprises vacuum deposited metal.

6. The metal foil transfer sheet of claim 1 wherein the resin comprises an acrylic resin and a vinyl chloride-vinyl acetate copolymer resin.

7. A metal foil transfer sheet for selectively transferring a metal film to a xerographic image, the transfer sheet comprising, in successive layers:
    a carrier film;
    a metallic film comprising a vacuum deposited metal selected from the group consisting of aluminum, copper, chromium, tin, silver, gold and mixtures thereof; and
    an adhesive layer bonded to the metallic film and which is suitable to cause selective transfer of the metallic film to the xerographic image, the adhesive layer comprising a resin and containing a dispersion of 0.5 micron or larger titanium dioxide particulate material in a ratio of about 4 parts titanium dioxide to 3 parts resin.

8. The metal foil transfer sheet of claim 7 wherein the thickness of transfer sheet excluding the carrier film is between about 0.02 mils to bout 0.06 mils.

9. The metal foil transfer sheet of claim 7 wherein the thickness of the transfer sheet, excluding the carrier, is about 0.03 mils.

* * * * *